(12) United States Patent
Iwase

(10) Patent No.: US 11,052,642 B2
(45) Date of Patent: Jul. 6, 2021

(54) GAS BARRIER FILM AND METHOD FOR PRODUCING GAS BARRIER FILM

(71) Applicant: FUJIFILM Corporation, Tokyo (JP)

(72) Inventor: Eijiro Iwase, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/793,450

(22) Filed: Feb. 18, 2020

(65) Prior Publication Data
US 2020/0180285 A1 Jun. 11, 2020

Related U.S. Application Data

(63) Continuation of application No. PCT/JP2018/030529, filed on Aug. 17, 2018.

(30) Foreign Application Priority Data

Sep. 6, 2017 (JP) .............................. JP2017-171212
Jun. 6, 2018 (JP) .............................. JP2018-108197

(51) Int. Cl.
*B32B 27/08* (2006.01)
*B32B 7/023* (2019.01)
(Continued)

(52) U.S. Cl.
CPC .............. *B32B 27/08* (2013.01); *B32B 7/023* (2019.01); *B32B 27/306* (2013.01); *B32B 27/36* (2013.01);
(Continued)

(58) Field of Classification Search
CPC .. B32B 7/00–7/14; B32B 27/00–27/42; B32B 37/00–37/30; C23C 16/00–16/56
See application file for complete search history.

(56) References Cited

U.S. PATENT DOCUMENTS 7,811,669 B2 * 10/2010 Fujii .................... C23C 14/0021
428/451
2011/0240211 A1 10/2011 Iwase
(Continued)

FOREIGN PATENT DOCUMENTS

JP  2009-220530 A  10/2009
JP  2011-207126 A  10/2011
(Continued)

OTHER PUBLICATIONS

International Preliminary Report on Patentability and Written Opinion of the International Searching Authority (Forms PCT/IB/326, PCT/IB/373 and PCT/ISA/237) for International Application No. PCT/JP2018/030529, dated Mar. 19, 2020, with English translation.
(Continued)

*Primary Examiner* — Prashant J Khatri
(74) *Attorney, Agent, or Firm* — Birch, Stewart, Kolasch & Birch, LLP

(57) ABSTRACT

A gas barrier film has, in sequence, a support, an inorganic layer, and a resin film, the inorganic layer and the resin film being supported on the support. The resin film has a hydroxy group. The inorganic layer and the resin film are directly joined to each other with separate portions that are partially present at an interface between the inorganic layer and the resin film. The gas barrier film has one or more sets of a combination of the inorganic layer and the resin film. A method for producing the gas barrier film includes forming an inorganic layer by a gas-phase deposition method, subsequently laminating a resin film having a hydroxy group with the inorganic layer, and heating the resulting film laminate.

9 Claims, 4 Drawing Sheets

(51) Int. Cl.
  *B32B 27/30* (2006.01)
  *B32B 27/36* (2006.01)
  *B32B 37/00* (2006.01)
  *C23C 16/34* (2006.01)

(52) U.S. Cl.
  CPC ........ *B32B 37/0053* (2013.01); *C23C 16/345* (2013.01); *B32B 2255/10* (2013.01); *B32B 2255/20* (2013.01); *B32B 2255/26* (2013.01); *B32B 2307/418* (2013.01); *B32B 2307/7242* (2013.01)

(56) References Cited

U.S. PATENT DOCUMENTS

| | | | |
|---|---|---|---|
| 2012/0270058 A1* | 10/2012 | Tsumagari | C08J 7/046 428/447 |
| 2016/0368236 A1 | 12/2016 | Iwase | |
| 2017/0320306 A1 | 11/2017 | Iwase | |
| 2018/0237908 A1 | 8/2018 | Kato et al. | |
| 2018/0364398 A1 | 12/2018 | Iwase | |
| 2019/0001643 A1 | 1/2019 | Nakayama | |

FOREIGN PATENT DOCUMENTS

| | | |
|---|---|---|
| JP | 2013-180419 A | 9/2013 |
| JP | 2015-171796 A | 10/2015 |
| JP | 2017-81143 A | 5/2017 |
| JP | 2017-136827 A | 8/2017 |
| WO | WO 2016/125532 A1 | 8/2016 |
| WO | WO 2017/154397 A1 | 9/2017 |

OTHER PUBLICATIONS

International Search Report (Form PCT/ISA/210) for International Application No. PCT/JP2018/030529, dated Oct. 2, 2018, with English translation.

* cited by examiner

GAS BARRIER FILM AND METHOD FOR PRODUCING GAS BARRIER FILM

CROSS-REFERENCE TO RELATED APPLICATIONS

This application is a Continuation of PCT International Application No. PCT/JP2018/030529 filed on Aug. 17, 2018, which claims priority under 35 U.S.C § 119(a) to Japanese Patent Application No. 2017-171212 filed on Sep. 6, 2017, and Japanese Patent Application No. 2018-108197 filed on Jun. 6, 2018. Each of the above application(s) is hereby expressly incorporated by reference, in its entirety, into the present application.

BACKGROUND OF THE INVENTION

1. Field of the Invention

The present invention relates to a gas barrier film and a method for producing the gas barrier film.

2. Description of the Related Art

Gas barrier films are used in order to protect elements and the like that are degraded by, for example, water and/or oxygen, such as solar cells, organic electroluminescence elements, and illumination devices using quantum dots.

A known example of a gas barrier film having high gas barrier properties is a gas barrier film having a laminated structure that includes an organic layer and an inorganic layer. Such a gas barrier film having a laminated structure that includes an organic layer and an inorganic layer has a configuration in which at least one set of a combination of an inorganic layer that mainly exhibits gas barrier properties and an underlying organic layer serving as an underlayer (undercoat layer) of the inorganic layer is formed on a surface of a support.

In such an existing gas barrier film having a laminated structure that includes an organic layer and an inorganic layer, an organic layer (protective organic layer) for protecting an inorganic layer is formed as an uppermost layer.

If the uppermost layer is formed of an inorganic film, an inorganic layer may be broken by, for example, contact, and desired gas barrier properties cannot be achieved. Therefore, an organic layer is formed as an uppermost layer in order to prevent the inorganic layer from breaking.

In such a gas barrier film having a laminated structure that includes an organic layer and an inorganic layer, after the formation of the inorganic layer, a laminate film (protective film) is laminated on an inorganic layer in order to protect the inorganic layer until an organic layer is formed after the formation of the inorganic layer.

For example, JP2011-207126A discloses a gas barrier film (method for producing a functional film) including a step of continuously supplying an elongated support; a step of depositing an inorganic film under reduced pressure; and a step of winding the support on a roll under reduced pressure while interposing a laminate film that imparts slidability between the inorganic film and the support and that has a surface roughness Ra equal to or less than the thickness of the inorganic film.

JP2015-171798A discloses a gas barrier film (laminate having a barrier property) that includes a first organic layer, an inorganic layer, and a second organic layer in this order, in which the second organic layer is a layer formed by curing a polymerizable composition that is applied directly to a surface of the inorganic layer, the polymerizable composition includes a urethane-skeleton acrylate polymer, the urethane-skeleton acrylate polymer has a structure that includes an acrylic main chain and a side chain including a urethane polymer unit or a urethane oligomer unit, and the side chain has an acryloyl group at an end thereof.

JP2015-171798A further discloses that a sealant film is stuck to this gas barrier film with an adhesive, and the resulting film is used as a transfusion bag.

SUMMARY OF THE INVENTION

As disclosed in JP2011-207126A and JP2015-171798A, regarding a gas barrier film having a laminated structure that includes an organic layer and an inorganic layer, breaking of an inorganic film cannot be prevented, and a gas barrier film having a high performance cannot be provided unless a certain protective layer is formed on the inorganic film. That is, it is important that a surface of a gas barrier film have, for example, a layer having a function of protecting an inorganic layer and a functional layer that enhances affinity for a product that uses the gas barrier film.

In this respect, the gas barrier films disclosed in JP2011-207126A and JP2015-171798A are very functional and have a good performance including a high performance for protecting an inorganic layer.

However, the production processes of the gas barrier films having a laminated structure that includes an organic layer and an inorganic layer are very complicated.

Specifically, in producing such a gas barrier film having a laminated structure that includes an organic layer and an inorganic layer, after the formation of an inorganic layer, in a film-forming apparatus for the inorganic layer, a protective film is laminated with the inorganic layer and the resulting laminate is wound into a roll. Subsequently, the roll is removed from the film-forming apparatus for the inorganic layer and loaded in a film-forming apparatus for an organic layer, and the protective film is peeled off. Subsequently, an organic layer is formed on the inorganic layer.

As described above, although the existing gas barrier film having a laminated structure that includes an organic layer and an inorganic layer has good gas barrier properties, the production process of the gas barrier film is very complicated. Specifically, in order to form an organic layer that protects an inorganic layer, it is necessary to perform the steps of, after the formation of the inorganic layer, for example, laminating a protective film, removing a roll from a film-forming apparatus for the inorganic layer and loading the roll in a film-forming apparatus for an organic layer, and peeling off the protective film.

An object of the present invention is to solve the problem described above and to provide, in a gas barrier film having an inorganic layer that exhibits gas barrier properties, a novel gas barrier film that requires neither the lamination of a protective film nor the formation of a protective organic layer by application and that has a high performance for protecting an inorganic layer, and a method for producing the gas barrier film.

According to the present invention, the problem is solved by the following configurations.

[1] A gas barrier film having, in sequence, a support, an inorganic layer, and a resin film, the inorganic layer and the resin film being supported on the support, in which the resin film has a hydroxy group, the inorganic layer and the resin film are directly joined to each other with separate portions that are partially present at an interface between the inorganic layer and the resin film, and the gas barrier film has one or more sets of a combination of the inorganic layer and the resin film.

[2] The gas barrier film according to [1], in which the inorganic layer includes a compound containing silicon.

[3] The gas barrier film according to [2], in which the inorganic layer and the resin film are joined to each other by a covalent bond of Si—O—C.

[4] The gas barrier film according to any one of [1] to [3], in which the resin film is formed of an ethylene-vinyl alcohol copolymer.

[5] The gas barrier film according to any one of [1] to [4], in which the resin film has a melting point of 100° C. or higher.

[6] The gas barrier film according to any one of [1] to [5], in which the resin film has a lower refractive index than the support.

[7] The gas barrier film according to any one of [1] to [6], further having an organic layer on a surface of the support, in which the inorganic layer is disposed on a surface of the organic layer.

[8] The gas barrier film according to any one of [1] to [7], further having an inorganic layer and a support in this order on a surface of the resin film on a side opposite to the inorganic layer that is directly joined to the resin film.

[9] A method for producing a gas barrier film, the method having a deposition step of forming an inorganic layer by a gas-phase deposition method, a lamination step of laminating, on a surface of the inorganic layer, a resin film having a hydroxy group, and a heating step of heating the inorganic layer and the resin film.

[10] The method for producing a gas barrier film according to [9], in which the deposition step and the lamination step are performed in vacuum, or the deposition step, the lamination step, and the heating step are performed in vacuum.

[11] The method for producing a gas barrier film according to [9] or [10], in which the gas barrier film has a support that supports the inorganic layer and the resin film, and the heating step is performed such that a temperature of the support is 100° C. or higher.

[12] The method for producing a gas barrier film according to any one of [9] to [11], in which at least one step of the deposition step, the lamination step, or the heating step is performed by a roll-to-roll process.

According to the present invention, there are provided a novel gas barrier film having an inorganic layer, in which neither the lamination of a protective film nor the formation of a protective organic layer is required and the gas barrier film has a high performance for protecting the inorganic layer, and a method for producing the gas barrier film.

DESCRIPTION OF THE PREFERRED EMBODIMENTS

Hereafter, a gas barrier film and a method for producing a gas barrier film according to embodiments of the present invention will be described with reference to the drawings.

Gas Barrier Film

Figure 1:
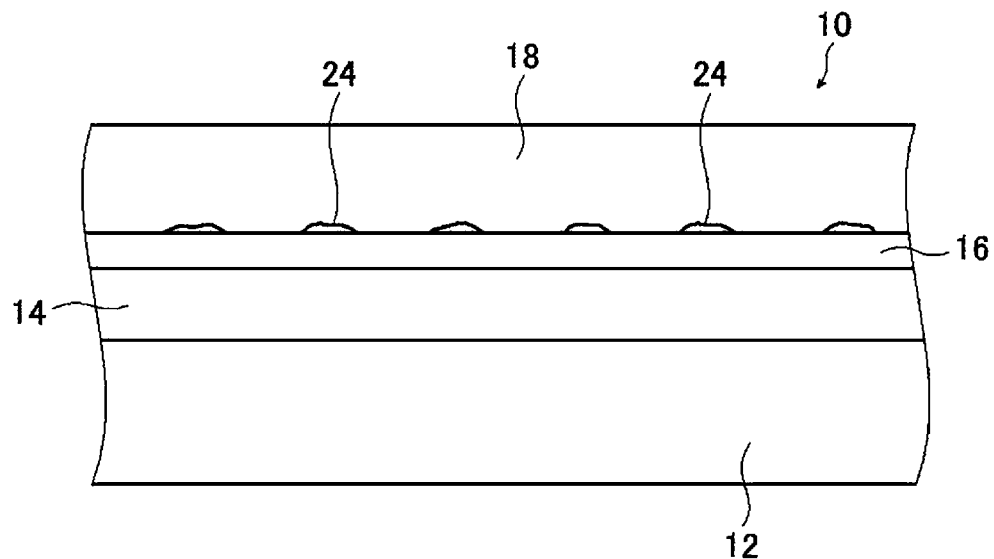
FIG. 1 is a conceptual diagram illustrating an example of a gas barrier film of the present invention.

FIG. 1 conceptually illustrates an example of a gas barrier film of the present invention.

FIG. 1 is a conceptual diagram of a gas barrier film of the present invention, viewed from a plane direction of a principal surface of the gas barrier film. The principal surface refers to a largest surface of a sheet-like product (film or plate-like product).

A gas barrier film 10 illustrated in FIG. 1 has a support 12, an underlying organic layer 14, an inorganic layer 16, and a resin film 18.

As described in detail later, the resin film 18 has a hydroxy group, and the inorganic layer 16 and the resin film 18 are directly joined to each other without a sticking layer therebetween, the sticking layer being used for sticking the inorganic layer 16 and the resin film 18, and with a plurality of separate portions 24 that are partially present at the interface therebetween. The underlying organic layer 14 is provided as a preferred embodiment and is not an essential component in the gas barrier film of the present invention.

In the description below, the support 12 side of the gas barrier film 10 may be referred to as a "top", and the resin film 18 side may be referred to as a "bottom".

Support

The support 12 may be a publicly known sheet-like product (film or plate-like product) that is used as a support for various gas barrier films, various laminate functional films, and the like.

The material of the support 12 is not limited, and various materials can be used as long as the underlying organic layer 14 and the inorganic layer 16 can be formed on the material, and a heating step after lamination of the resin film 18, which will be described later, can be performed. Preferably, examples of the material of the support 12 include various resin materials.

Examples of the material of the support 12 include polyethylene (PE), polyethylene naphthalate (PEN), polyamides (PA), polyethylene terephthalate (PET), polyvinyl chloride (PVC), polyvinyl alcohol (PVA), polyacrylonitrile (PAN), polyimides (PI), transparent polyimides, polymethyl methacrylate resins (PMMA), polycarbonates (PC), polyacrylates, polymethacrylates, polypropylene (PP), polystyrene (PS), acrylonitrile-butadiene-styrene copolymers (ABS), cycloolefin copolymers (COC), cycloolefin polymers (COP), triacetyl cellulose (TAC), and ethylene-vinyl alcohol copolymers (EVOH).

The thickness of the support 12 can be appropriately set in accordance with, for example, the use and the material.

The thickness of the support 12 is not limited but is preferably 5 to 150 μm and more preferably 10 to 100 μm from the viewpoints of, for example, sufficiently ensuring the mechanical strength of the gas barrier film 10, obtaining a gas barrier film having good flexibility (flexible properties), and reducing the weight and the thickness of the gas barrier film 10.

Underlying Organic Layer

In the gas barrier film 10, the underlying organic layer 14 can be formed on one surface of the support 12.

The underlying organic layer 14 is, for example, a layer composed of an organic compound obtained by polymerizing (crosslinking, curing) a monomer, a dimer, an oligomer, and the like. As described above, the underlying organic layer 14 is disposed as a preferred embodiment.

The underlying organic layer 14 serving as an underlayer of the inorganic layer 16 is a layer serving as a base for appropriately forming the inorganic layer 16.

The underlying organic layer 14 formed on a surface of the support 12 allows irregularities on the surface of the support 12 and foreign matter or the like adhering to the surface to be embedded therein to make the formation surface of the inorganic layer 16 appropriate, and enables the inorganic layer 16 to be appropriately formed.

As described later, the gas barrier film of the present invention may have a plurality of sets of a combination of the inorganic layer 16 and the underlying organic layer 14. In such a case, the second and subsequent underlying organic layers 14 are each formed on an inorganic layer 16. With this configuration, each of the underlying organic layers 14 serving as an underlayer of an inorganic layer 16 (formation surface of an inorganic layer 16) exhibits a similar function.

In particular, when the gas barrier film 10 has such an underlying organic layer 14 on the surface of the support 12, the inorganic layer 16 that mainly exhibits gas barrier properties can be appropriately formed.

The underlying organic layer 14 is formed by, for example, curing an organic layer-forming composition containing an organic compound (such as a monomer, a dimer, a trimer, an oligomer, and a polymer). The organic layer-forming composition may contain one organic compound or two or more organic compounds.

The underlying organic layer 14 contains, for example, a thermoplastic resin and an organosilicon compound. Examples of the thermoplastic resin include polyesters, (meth)acrylic resins, methacrylic acid-maleic acid copolymers, polystyrene, transparent fluororesins, polyimides, fluorinated polyimides, polyamides, polyamide-imides, polyetherimides, cellulose acylate, polyurethanes, polyether ether ketone, polycarbonates, alicyclic polyolefins, polyarylates, polyether sulfones, polysulfones, fluorene-ring modified polycarbonates, alicyclic-modified polycarbonates, fluorene ring-modified polyesters, and acrylic compounds. An example of the organosilicon compound is polysiloxane.

The underlying organic layer 14 preferably includes a polymer of a radically curable compound and/or a cationically curable compound having an ether group from the viewpoints of good strength and the glass transition temperature of the underlying organic layer 14.

The underlying organic layer 14 preferably includes a (meth)acrylic resin that contains, as a main component, a polymer derived from a monomer, an oligomer, or the like of a (meth)acrylate from the viewpoint of decreasing the refractive index of the underlying organic layer 14. The decrease in the refractive index of the underlying organic layer 14 enhances transparency and improves a light-transmitting property.

The underlying organic layer 14 more preferably includes a (meth)acrylic resin that contains, as a main component, a polymer derived from a monomer, a dimer, an oligomer, and the like of a bifunctional or higher functional (meth)acrylate such as dipropylene glycol di(meth)acrylate (DPGDA), trimethylolpropane tri(meth)acrylate (TMPTA), or dipentaerythritol hexa(meth)acrylate (DPHA) and still more preferably includes a (meth)acrylic resin that contains, as a main component, a polymer derived from a monomer, a dimer, an oligomer, and the like of a trifunctional or higher functional (meth)acrylate. These (meth)acrylic resins may be used in combination of two or more thereof. The main component refers to a component having the highest mass content ratio among all components contained.

The organic layer-forming composition preferably includes, for example, an organic solvent, a surfactant, and a silane coupling agent in addition to the organic compound.

When a plurality of underlying organic layers 14 are disposed, that is, when the gas barrier film 10 has a plurality of sets of the combination of the underlying organic layer 14 and the inorganic layer 16, the materials of the respective underlying organic layers 14 may be the same or different.

The thickness of the underlying organic layer 14 is not limited and can be appropriately set in accordance with, for example, the components included in the organic layer-forming composition and the support 12 used.

The thickness of the underlying organic layer 14 is preferably 0.1 to 5 μm and more preferably 0.2 to 3 μm. A thickness of the underlying organic layer 14 of 0.1 μm or more is preferred from the viewpoint that, for example, irregularities on the surface of the support 12 and foreign matter or the like adhering to the surface are embedded, and the surface of the underlying organic layer 14 can be planarized. A thickness of the underlying organic layer 14 of 5 μm or less is preferred from the viewpoints that, for example, cracks in the underlying organic layer 14 can be prevented, flexibility of the gas barrier film 10 can be enhanced, and the thickness and the weight of the gas barrier film 10 can be reduced.

When a plurality of underlying organic layers 14 are disposed, that is, when the gas barrier film 10 has a plurality of sets of the combination of the inorganic layer 16 and the underlying organic layer 14, the thicknesses of the underlying organic layers 14 may be the same or different.

The thicknesses of the inorganic layers 16 may also be the same or different.

The underlying organic layer 14 can be formed by a publicly known method suitable for the material.

For example, the underlying organic layer 14 can be formed by a coating method including applying the organic layer-forming composition described above, and drying the organic layer-forming composition. In the formation of the underlying organic layer 14 by the coating method, the dried organic layer-forming composition is further irradiated with ultraviolet rays, as needed, to thereby polymerize (crosslink) the organic compound in the organic layer-forming composition.

The underlying organic layer 14 is preferably formed by a roll-to-roll process. In the description below, the "roll-to-roll process" is also referred to as "R-to-R".

As is well known, R-to-R is a production method in which a long sheet-like product is fed from a roll of the long sheet-like product and is subjected to film formation while being transported in the longitudinal direction, and the sheet-like product after the film formation is wound into a roll. The use of R-to-R achieves high productivity and high production efficiency.

Inorganic Layer

The inorganic layer 16 is a thin film including an inorganic compound and is disposed on a surface of the underlying organic layer 14 or a surface of a resin film 18 described later. In the gas barrier film 10, the inorganic layer 16 mainly exhibits gas barrier properties.

The surface of the support 12 has regions where a film of an inorganic compound is not easily deposited, such as irregularities and portions hidden behind foreign matter. The regions where a film of an inorganic compound is not easily deposited are covered by disposing the underlying organic layer 14, and the inorganic layer 16 is then formed on the underlying organic layer 14. Therefore, the inorganic layer 16 can be formed, without gaps, on the surface on which the inorganic layer 16 is to be formed.

The material of the inorganic layer 16 is not limited. It is possible to use various inorganic compounds that exhibit gas barrier properties and that are used for publicly known gas barrier layers.

Examples of the material of the inorganic layer 16 include inorganic compounds such as metal oxides, e.g., aluminum oxide, magnesium oxide, tantalum oxide, zirconium oxide, titanium oxide, and indium tin oxide (ITO); metal nitrides, e.g., aluminum nitride; metal carbides, e.g., aluminum carbide; oxides of silicon, e.g., silicon oxide, silicon oxynitride, silicon oxycarbide, and silicon oxycarbonitride; nitrides of silicon, e.g., silicon nitride and silicon carbonitride; carbides of silicon, e.g., silicon carbide; hydrides thereof; mixtures of two or more thereof; and hydrogen-containing products thereof. Mixtures of two or more of these inorganic compounds can also be used.

Of these, silicon nitride, silicon oxide, silicon oxynitride, aluminum oxide, and mixtures of two or more of these inorganic compounds are suitably used from the viewpoints of high transparency and good gas barrier properties. Of these, compounds containing silicon are suitably used. In particular, of these, silicon nitride is suitably used from the viewpoint of good gas barrier properties. The inorganic layer 16 preferably has a higher density of silicon from the viewpoint of enhancing the adhesion strength (joint strength) with the resin film 18 described later.

The thickness of the inorganic layer 16 is not limited and can be appropriately set in accordance with the material such that intended gas barrier properties can be exhibited.

The thickness of the inorganic layer 16 is preferably 10 to 150 nm, more preferably 12 to 100 nm, and still more preferably 15 to 75 nm.

A thickness of the inorganic layer 16 of 10 nm or more is preferred from the viewpoint of forming an inorganic layer 16 that stably exhibits a sufficient gas barrier performance. The inorganic layer 16 is generally brittle. When the inorganic layer 16 has an excessively large thickness, for example, breaking, cracking, and separation of the inorganic layer 16 may occur. However, the occurrence of breaking can be prevented by setting the thickness of the inorganic layer 16 to 150 nm or less.

As described later, when a plurality of inorganic layers 16 are disposed, the thicknesses of the inorganic layers 16 may be the same or different.

When a plurality of inorganic layers 16 are disposed, the materials of the inorganic layers 16 may be the same or different.

The inorganic layer 16 can be formed by a publicly known method suitable for the material.

Preferred examples of the method include various gas-phase deposition methods such as plasma chemical vapor deposition (CVD), e.g., CCP (capacitively coupled plasma)-CVD and ICP (inductively coupled plasma)-CVD; atomic layer deposition (ALD); sputtering, e.g., magnetron sputtering and reactive sputtering; and vacuum vapor deposition.

The inorganic layer 16 is also preferably formed by R-to-R.

In the gas barrier film 10, the resin film 18 is laminated on (a surface of) the inorganic layer 16, and the inorganic layer 16 and the resin film 18 are joined (stuck) to each other.

The resin film 18 is a film having a hydroxy group (—OH group).

In the gas barrier film 10 of the present invention, the inorganic layer 16 and the resin film 18 on the inorganic layer 16 (on the side opposite to the support 12) are directly joined to each other by a chemical bond without a sticking layer (such as an adhesive layer (adhesive agent), a tacky layer (tackiness agent), or an easy-adhesion layer) for sticking the inorganic layer 16 and the resin film 18 therebetween, in a state where a plurality of separate portions 24 are partially disposed at the interface.

This configuration of the gas barrier film 10 of the present invention realizes a novel gas barrier film that is capable of sufficiently protecting the inorganic layer 16 and that requires neither the lamination of a protective film after the formation of the inorganic layer 16 nor the formation, by coating, of a protective organic layer for protecting the inorganic layer 16.

As described above, in producing a known existing gas barrier film having a laminated structure that includes an organic layer and an inorganic layer by R-to-R, after the formation of the inorganic layer, in a film-forming apparatus for the inorganic layer (in a vacuum chamber), a protective film is laminated with the inorganic layer and the resulting laminate is wound.

Subsequently, the roll obtained by winding the film is loaded in a film-forming apparatus for an organic layer, and the protective film is peeled off. Subsequently, a protective organic layer for protecting the inorganic layer is formed on the inorganic layer by a coating method.

That is, the production process of the existing gas barrier film having a laminated structure that includes an organic layer and an inorganic layer is very complicated. Specifically, in order to form an organic layer that protects an inorganic layer, it is necessary to perform the steps of, after the formation of the inorganic layer, for example, laminating a protective film, removing a roll from a film-forming apparatus for the inorganic layer, loading the roll in a film-forming apparatus for an organic layer, and peeling off the protective film.

A conceivable method for avoiding this disadvantage is a method including, after the formation of an inorganic layer, sticking a functional film, such as a sealant film, on the inorganic layer instead of the protective organic layer.

However, in this method, a sticking layer for sticking the functional film is necessary. In addition, a sticking agent cannot be applied in vacuum. Although the sticking agent can be applied in advance to the functional film or the like, the process becomes complicated, and the resulting film cannot be transported unless a separator or the like is disposed on the sticking layer. Accordingly, the functional film must be stuck while the separator is peeled off in the film-forming apparatus for the inorganic layer. Furthermore, evenness in sticking of the functional film is unlikely to be achieved.

In addition to this, some problems may occur when a sticking layer is disposed between an inorganic film that exhibits gas barrier properties and a functional film laminated on a surface of the inorganic layer.

Specifically, if the sticking layer is present between the inorganic layer and the functional film, the thickness of the gas barrier film is increased by the thickness of the sticking layer. In addition, water, oxygen, and the like easily enter from an end face of the sticking layer. Furthermore, the sticking layer often has a problem in terms of durability, for example, the color of the sticking layer may change depending on the temperature and the humidity. Accordingly, in the case where a functional film or the like is laminated on a surface of an inorganic layer, preferably, a sticking layer is not disposed to the extent possible.

In order to solve the problems described above, the inventor of the present invention has conducted extensive studies.

As a result, it has been found that, by laminating a resin film 18 that includes a resin having a hydroxy group, such as EVOH, on a surface of an inorganic layer 16 and performing heating, the inorganic layer 16 and the resin film 18 can be directly and strongly joined to each other by a chemical bond even without having a sticking layer (sticking agent) therebetween. It has also been found that, by disposing this resin film 18, the inorganic layer 16 is protected and breaking thereof is prevented as in the case of the protective organic layer formed by a coating method, and a gas barrier film 10 having intended gas barrier properties is obtained.

As described above, the inorganic layer 16 is formed by a gas-phase deposition method such as plasma CVD. The surface of the inorganic layer 16 formed by a gas-phase deposition method is in a state of high activity. For example, when the inorganic layer 16 is composed of a compound containing silicon, a large number of portions in a state of a Si radical (Si—), a state of Si—O—, and a state of Si—OH are present on the surface of the inorganic layer 16, and the surface is in a state of high activity.

When the resin film 18 is laminated on and brought into close contact with such an inorganic layer 16, Si radicals etc. on the surface of the inorganic layer 16 and hydroxy groups on the surface of the resin film 18 face each other. By performing heating in this state, the Si radicals etc. on the surface of the inorganic layer 16 and the hydroxy groups on the surface of the resin film 18 are allowed to react with each other and subjected to dehydration condensation.

As a result, the inorganic layer 16 and the resin film 18 are chemically bound to each other by a covalent bond of Si—O—C. Thus, the inorganic layer 16 and the resin film 18 are directly and strongly joined to each other even without a sticking layer therebetween.

This novel gas barrier film 10 of the present invention in which the resin film 18 is joined to the inorganic layer 16 by directly laminating the resin film 18 on the inorganic layer 16 has a large number of advantages.

First, since the resin film 18 is a film having a certain degree of thickness, the resin film 18 can protect the inorganic layer 16 as described above, and gas barrier properties of the inorganic layer 16 are sufficiently exhibited. Thus, a gas barrier film 10 having intended gas barrier properties is provided.

When the resin film 18 has a lower refractive index than the support 12, a gas barrier film 10 having a high light transmittance (transparency) is provided.

By using a resin film having thermal weldability as the resin film 18, the resin film 18 can also be used as a sealant layer. As a result, the gas barrier film 10 can be directly stuck on a wrapping material, a transfusion bag, or the like.

The resin film 18 has a low oxygen permeability and can prevent oxygen from entering from an end face thereof. Therefore, the gas barrier film 10 of the present invention is also suitable as a film for protecting a material that is degraded by oxygen, for example, a quantum dot material.

The resin film 18 (in particular, EVOH or the like) also has good affinity for adhesives such as PVA and ethylene-vinyl acetate (EVA) copolymers. Therefore, the gas barrier film 10 of the present invention is also suitable for sticking with, for example, a fluorine-containing sheet and an element using CIGS (Cu—In—Ga—Se) and thus can also be suitably used as a front sheet of a solar cell.

Furthermore, as described later, the product of the gas barrier film of the present invention can be completed by, after the formation of an inorganic layer 16, laminating a resin film 18 and joining the inorganic layer 16 and the resin film 18 to each other by heating in a film-forming apparatus for the inorganic layer 16 (in a vacuum chamber). Accordingly, the production process can be simplified by eliminating the need for, for example, sticking and peeling off of a protective film, removal of a roll from an inorganic film-forming apparatus, loading of the roll in an organic film-forming apparatus, and formation of an organic layer to thereby improve productivity. Furthermore, the production cost can also be reduced.

Here, unlike the formation of an organic layer on a surface of an inorganic layer by a coating method, the gas barrier film 10 of the present invention is formed by directly joining a solid that is an inorganic layer 16 and a solid that is a resin film 18 to each other.

Therefore, even when the inorganic layer 16 and the resin film 18 are laminated and joined to each other in vacuum, the inorganic layer 16 is not in contact with the resin film 18 over the entire surface, and a plurality of separate portions 24, in which the inorganic layer 16 and the resin film 18 are partially separated from each other, are present at the interface. That is, a plurality of gaps are partially present at the interface between the inorganic layer 16 and the resin film 18.

If an excessively large number of separate portions 24 are present, the joint strength between the inorganic layer 16 and the resin film 18 may be insufficient. Conversely, in order that the resin film 18 is laminated with the inorganic layer 16 and further joined to the inorganic layer 16 so as to completely eliminate the separate portions 24, various disadvantages are likely to occur, for example, lamination at a very high degree of vacuum is necessary, and pressing at a high pressure is necessary after lamination, which may damage the inorganic layer 16. Furthermore, since the separate portions 24, that is, the gaps are present at the interface between the inorganic layer 16 and the resin film 18, the gaps function like a cushion against an impact from the outside and effectively act to prevent the inorganic layer 16 from breaking.

Considering the points described above, on a section of the gas barrier film 10 of the present invention observed by means of, for example, a scanning electron microscope (SEM) and an optical microscope, a ratio of a total of the lengths of the separate portions 24 between the inorganic layer 16 and the resin film 18 to the total length of the interface (opposing faces) between the inorganic layer 16 and the resin film 18 is preferably 0.01% to 50%, and more preferably 1% to 10%. This section of the gas barrier film 10 is specifically a section in a direction orthogonal to the principal surface, that is, a section in the thickness direction.

The ratio of the total of the lengths of the separate portions 24 to the total length of the interface between the inorganic layer 16 and the resin film 18 on a section of the gas barrier film 10 is determined as follows. The measurement is performed at an arbitrary interface having a length of 50 mm or more on arbitrarily selected ten positions of the section. The average of the results is defined as the ratio of the total of the lengths of the separate portions 24 to the total length of the interface between the inorganic layer 16 and the resin film 18 on a section of the gas barrier film 10.

Various resin materials having hydroxy groups can be used as the material of the resin film 18.

Examples thereof include ethylene-vinyl alcohol copolymers (EVOH) and PVA. Of these, EVOH is suitably used from the viewpoints of, for example, having good adhesion to the inorganic layer 16 and suitably exhibiting the various advantages described above.

Commercially available products can also be suitably used as the resin film 18. Examples of commercially available products of EVOH include EVAL manufactured by Kuraray Co., Ltd. and SOARNOL manufactured by The Nippon Synthetic Chemical Industry Co., Ltd.

In the present invention, besides a film composed of a resin having a hydroxy group as a molecule, a resin film obtained by introducing a hydroxy group on a surface of a film composed of a resin having, as a molecule, no hydroxy group, such as PE or PP, can also be used as the resin film 18.

Various publicly known methods can be employed as a method for introducing a hydroxy group on a surface of a film composed of a resin having no hydroxy group. Examples of the method include plasma treatment and corona treatment.

In the gas barrier film 10 of the present invention, the melting point of the resin film 18 is not limited but is preferably 100° C. or higher, more preferably 120° C. or higher, and still more preferably 140° C. or higher.

As described in detail later, the gas barrier film 10 of the present invention is produced by laminating the resin film 18 with the inorganic layer 16, and subsequently heating the resulting laminate to cause the dehydration condensation reaction to proceed, thereby directly joining the inorganic layer 16 and the resin film 18 to each other. This heating temperature is preferably 100° C. or higher. Therefore, by using a resin film having a melting point of 100° C. or higher as the resin film 18, degradation of the resin film 18 such as melting of the resin film 18 and an increase in the haze due to melting can be prevented.

In the production method of the present invention, immediately after the inorganic layer 16 is formed by plasma CVD or the like, the resin film 18 is preferably laminated in a deposition chamber. Here, immediately after the formation of the inorganic layer 16, the temperature of the inorganic layer 16 (support 12) is high. Accordingly, if the resin film 18 has a low melting point, a disadvantage such as melting of the resin film 18 may occur. However, such a disadvantage can also be prevented by using a resin film 18 having a melting point of 100° C. or higher.

Furthermore, the gas barrier film of the present invention may have a configuration in which another inorganic layer 16 is further formed on the resin film 18, and another resin film 18 is laminated thereon and joined to the other inorganic layer 16. In the case where an inorganic layer 16 is formed on the surface of a resin film 18 in this manner, the inorganic layer 16 is also formed by plasma CVD or the like. By using a resin film 18 having a melting point of 100° C. or higher as the resin film 18, for example, melting of the resin film 18 can be prevented during the formation of the inorganic layer 16.

The refractive index of the resin film 18 is preferably lower than the refractive index of the support 12. More preferably, the refractive index of the resin film 18 is at least 0.05 lower than that of the support 12.

When the resin film 18 has a lower refractive index than the support 12, a gas barrier film 10 having high transparency (light transmittance) is provided, as described above.

The thickness of the resin film 18 is also not limited and may be appropriately set in accordance with, for example, the layer configuration of the gas barrier film and durability required for the gas barrier film.

The thickness of the resin film 18 is preferably 1 to 50 µm, more preferably 5 to 30 µm, and still more preferably 10 to 20 µm.

A thickness of the resin film 18 of 1 µm or more is preferred from the viewpoint of, for example, suitably protecting the inorganic layer 16.

A thickness of the resin film 18 of 50 µm or less is preferred from the viewpoints of, for example, obtaining the gas barrier film 10 having high transparency, preventing the gas barrier film 10 from having an unnecessarily large thickness, obtaining the gas barrier film having good flexibility, and suppressing curling of the gas barrier film 10.

The gas barrier film 10 illustrated in FIG. 1 has one set of a combination of the inorganic layer 16 and the resin film 18, but the gas barrier film of the present invention is not limited thereto. Hereinafter, in the combination of the inorganic layer 16 and the resin film 18, the inorganic layer 16 may be referred to as an inorganic layer 16 on the support 12 side, and the resin film 18 may be referred to as a resin film 18 on the side opposite to the support 12.

Figure 2:
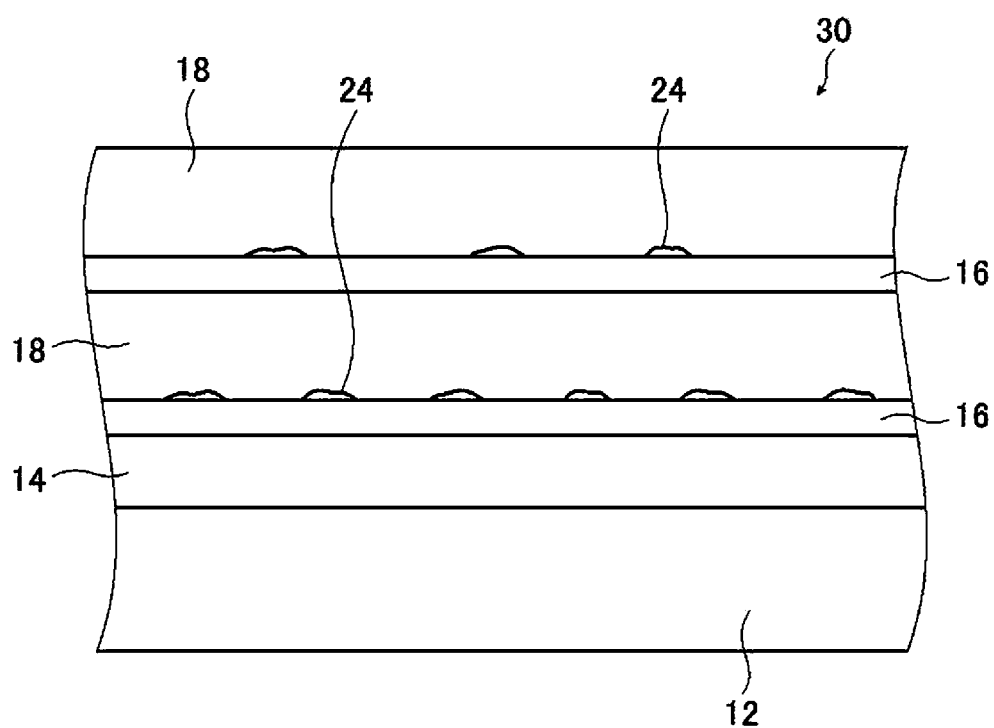
FIG. 2 is a conceptual diagram illustrating another example of a gas barrier film of the present invention.

For example, as in a gas barrier film 30 that is conceptually illustrated in FIG. 2, the gas barrier film may have two sets of the combination of the inorganic layer 16 on the support 12 side and the resin film 18 on the side opposite to the support 12. Alternatively, the gas barrier film may have three or more sets of the combination of the inorganic layer 16 on the support 12 side and the resin film 18 on the side opposite to the support 12.

In such cases, the thicknesses and/or the materials of the resin films 18 may be the same or different.

The gas barrier film 10 illustrated in FIG. 1 has one set of a combination of the underlying organic layer 14 and the inorganic layer 16, but the gas barrier film of the present invention is not limited thereto.

Figure 3:
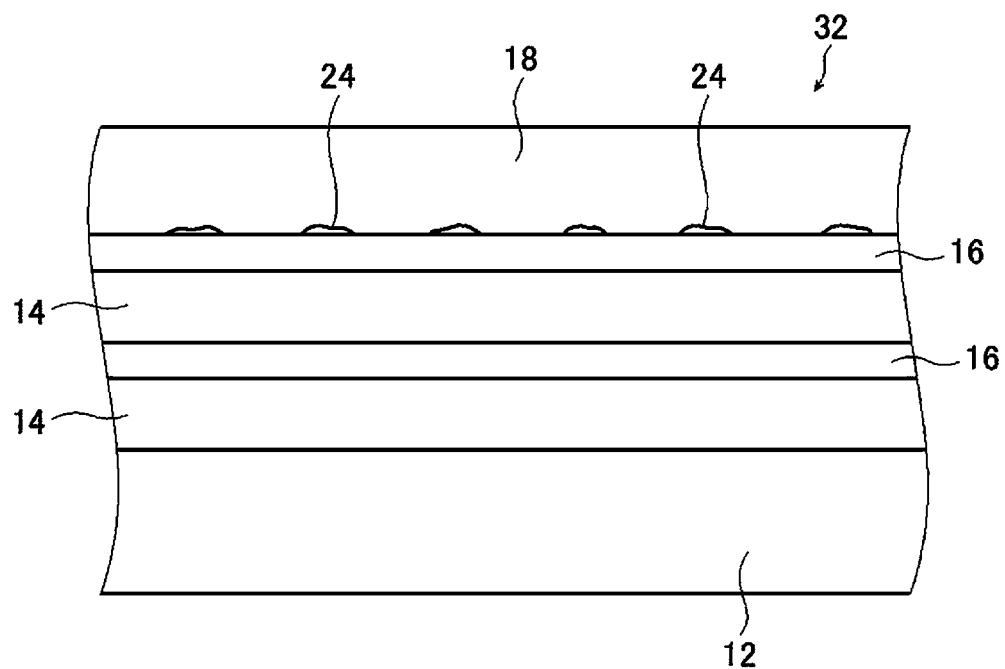
FIG. 3 is a conceptual diagram illustrating another example of a gas barrier film of the present invention.

For example, as in a gas barrier film 32 that is conceptually illustrated in FIG. 3, the gas barrier film may have two sets of the combination of the underlying organic layer 14 and the inorganic layer 16. Alternatively, the gas barrier film may have three or more sets of the combination of the underlying organic layer 14 and the inorganic layer 16.

Furthermore, the gas barrier film of the present invention may have two or more sets of the combination of the inorganic layer 16 on the support 12 side and the resin film 18 on the side opposite to the support 12 and two or more sets of the combination of the underlying organic layer 14 and the inorganic layer 16.

As described above, in the gas barrier film 10 of the present invention, the underlying organic layer 14 formed on the surface of the support 12 is disposed as a preferred embodiment. That is, the gas barrier film of the present invention may have a configuration in which an inorganic layer 16 is formed directly on a support 12, as in a gas barrier film 34 that is conceptually illustrated in FIG. 4.

Alternatively, it is also possible to use a configuration in which an inorganic layer 16 is formed directly on a support 12, and one or more sets of the combination of the underlying organic layer 14 and the inorganic layer 16 are formed as upper layers of the inorganic layer 16.

Figure 5:
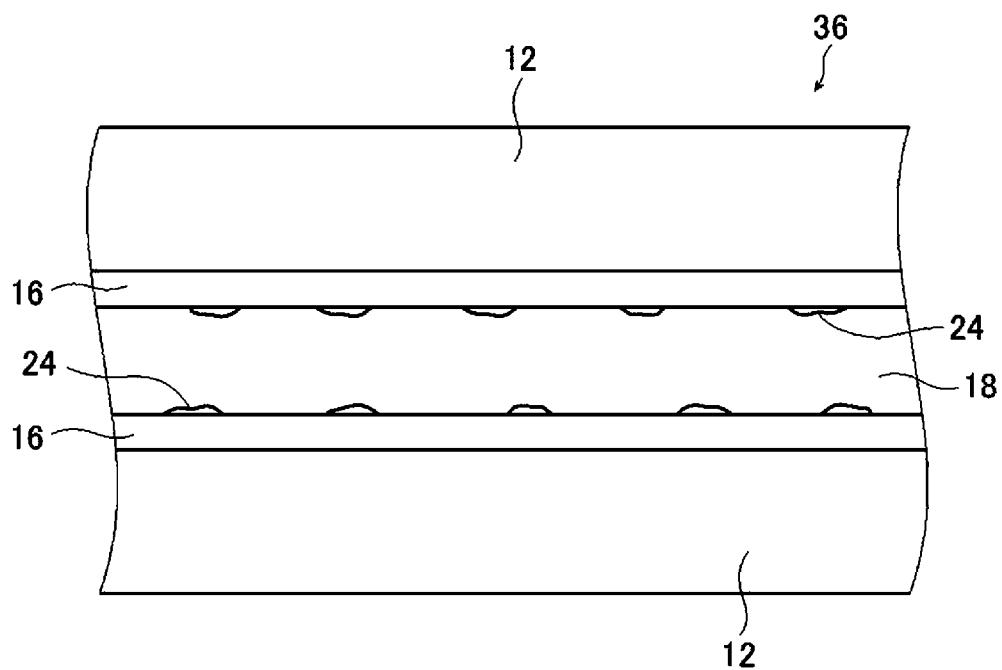
FIG. 5 is a conceptual diagram illustrating another example of a gas barrier film of the present invention.

Furthermore, as in a gas barrier film 36 that is conceptually illustrated in FIG. 5, the gas barrier film may have a configuration in which an inorganic layer 16 and a support 12 are disposed on each side of a resin film 18 so that the supports 12 form the outermost surfaces. In this configuration, an inorganic layer 16 and a support 12 are further disposed in this order on a surface of the resin film 18 on a side opposite to the inorganic layer 16 that is directly joined to the resin film 18.

In this configuration, the gas barrier film may have, on at least one surface of the resin film 18, two or more sets of a combination of the inorganic layer 16 on the support 12 side and the resin film 18 on the side opposite to the support 12. Furthermore, as in the configuration having an underlying organic layer 14 between the support 12 and the inorganic layer 16, the gas barrier film may have one or more sets of the combination of the underlying organic layer 14 and the inorganic layer 16.

Figure 6:
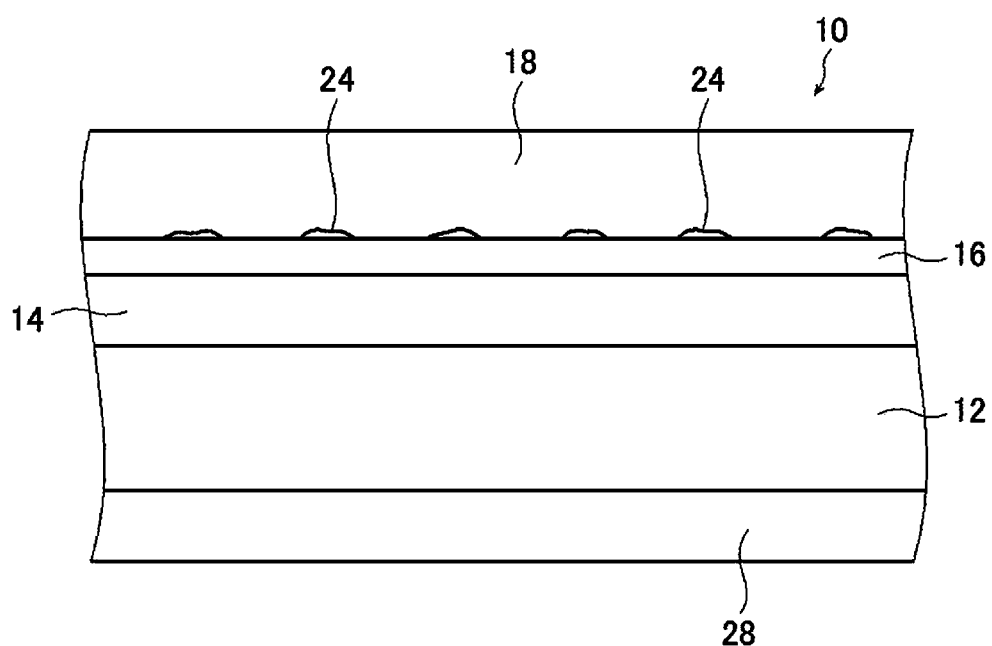
FIG. 6 is a conceptual diagram illustrating another example of a gas barrier film of the present invention.

As a gas barrier film 10 is conceptually illustrated as an example in FIG. 6, the gas barrier film of the present invention may include, on a surface of the support 12 opposite to the surface on which the inorganic layer 16 and the other layers are formed, a hard coat layer 28 such as a reinforcing layer, a sliding layer, a UV cut layer, and a protective layer for the purpose of, for example, improving stiffness, improving mechanical strength, improving slidability, shielding desired light, e.g., shielding ultraviolet rays (ultraviolet (UV) cut) and shielding blue light (blue light cut), and protecting the support 12. The hard coat layer 28 may be formed of a single layer or a plurality of layers such as a laminate of a UV cut layer and a sliding layer.

The hard coat layer 28 is not limited, and any layer composed of a material capable of imparting an intended function can be used. An example of the material of the hard coat layer 28 is a resin material. Examples of the resin material include various materials described as examples in the above underlying organic layer 14.

The thickness of the hard coat layer 28 is also not limited and may be appropriately set in accordance with, for example, the material of the hard coat layer 28, the function of the hard coat layer 28, and the thickness of the gas barrier film such that the hard coat layer 28 can exhibit an intended function.

That is, in the gas barrier film of the present invention, various layer configurations can be used as long as the gas barrier film has, in sequence, a support 12, an inorganic layer 16, and a resin film 18, the inorganic layer 16 and the resin film 18 being supported on the support 12, in which the gas barrier film has one or more sets of a combination of the inorganic layer 16 and the resin film 18 that are directly joined to each other with separate portions that are partially present at the interface.

Hereafter, an example of a method for producing a gas barrier film 10 of the present invention will be described with deference to conceptual diagrams of FIGS. 7 and 8.

Figure 7:
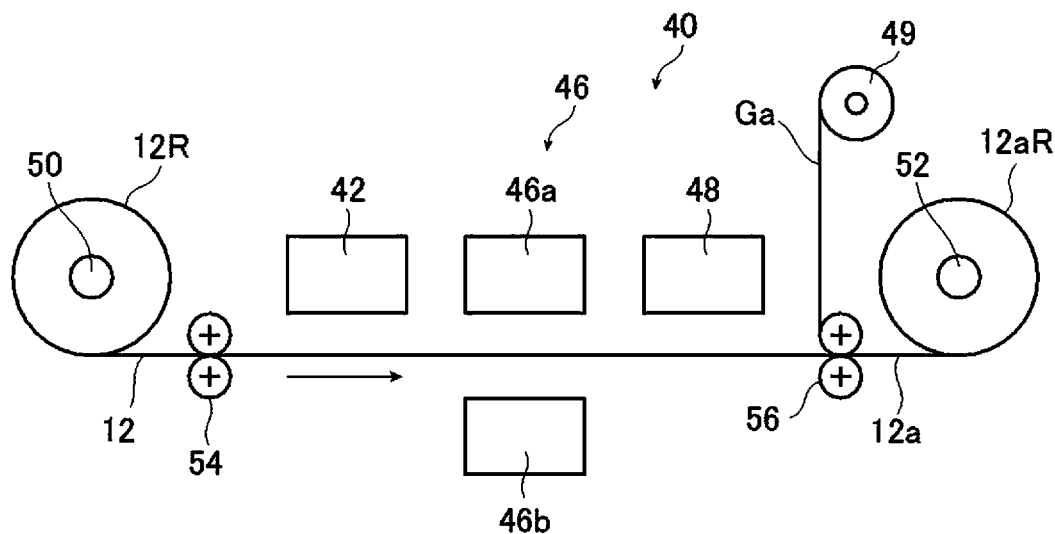
FIG. 7 is a conceptual diagram of an example of an organic film-forming apparatus for producing the gas barrier film illustrated in FIG. 1.

The apparatus illustrated in FIG. 7 is an organic film-forming apparatus 40 that forms an underlying organic layer 14. The organic film-forming apparatus 40 is configured to form an underlying organic layer 14 by R-to-R. In the organic film-forming apparatus 40, the above-described organic layer-forming composition for forming an underlying organic layer 14 is applied and dried while a long support 12 is transported in the longitudinal direction, and an organic compound contained in the organic layer-forming composition is subsequently polymerized (cured) by light irradiation to form the underlying organic layer 14.

The organic film-forming apparatus 40 illustrated as an example in the figure has, for example, a coating unit 42, a drying unit 46, a light irradiation unit 48, a rotational shaft 50, a winding shaft 52, and transportation roller pairs 54 and 56.

Figure 8:
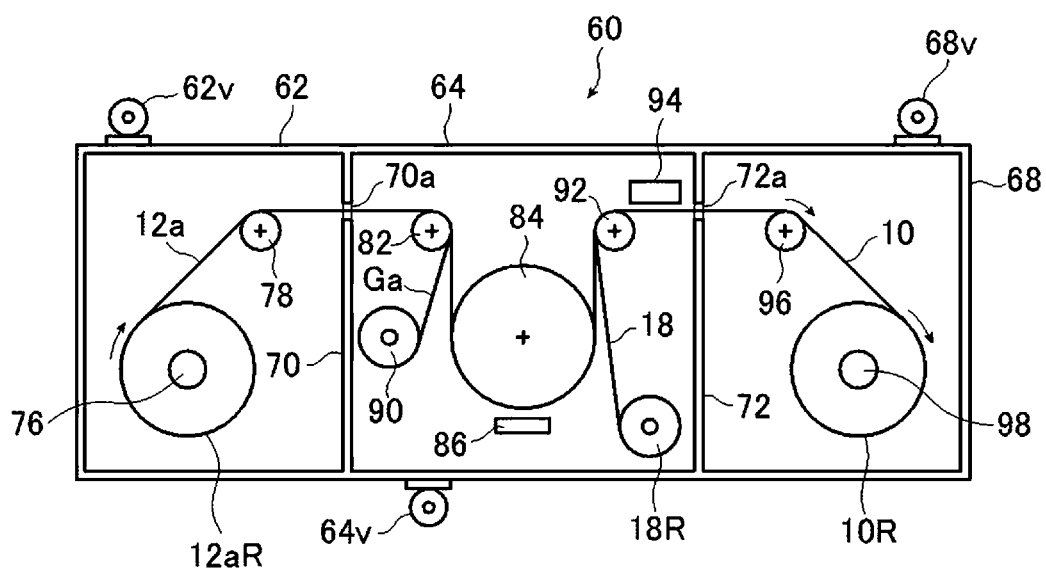
FIG. 8 is a conceptual diagram of an example of an inorganic film-forming apparatus for producing the gas barrier film illustrated in FIG. 1.

On the other hand, the apparatus illustrated in FIG. 8 is an inorganic film-forming apparatus 60 that forms an inorganic layer 16 and that laminates a resin film 18 with the inorganic layer 16 and joins the resin film 18 to the inorganic layer 16. The inorganic film-forming apparatus 60 also forms an inorganic layer 16 by R-to-R. In the inorganic film-forming apparatus 60, an inorganic layer 16 is formed on the underlying organic layer 14 on the support 12 while the long support 12 having the underlying organic layer 14 thereon is transported in the longitudinal direction, a resin film 18 is subsequently laminated on the surface of the inorganic layer 16, and the resulting support 12 is heated to join the inorganic layer 16 and the resin film 18 to each other.

The inorganic film-forming apparatus 60 illustrated as an example in the figure has a supply chamber 62, a deposition chamber 64, and a winding chamber 68. The supply chamber 62 and the deposition chamber 64 are separated from each other by a partition 70 having an opening 70a. The deposition chamber 64 and the winding chamber 68 are separated from each other by a partition 72 having an opening 72a.

In producing a gas barrier film 10, first, a support roll 12R obtained by winding a long support 12 is loaded on the rotational shaft 50, and the formation of the underlying organic layer 14 on a surface of the support 12 is performed.

After the support roll 12R is loaded on the rotational shaft 50, the support 12 is unwound from the support roll 12R and is caused to pass through a predetermined transport path that extends from the support roll 12R to the winding shaft 52 through the transportation roller pair 54, the coating unit 42, the drying unit 46, the light irradiation unit 48, and the transportation roller pair 56 in this order.

The support 12 unwound from the support roll 12R is transported by the transportation roller pair 54 to the coating unit 42, and a surface of the support 12 is coated with an organic layer-forming composition for forming an underlying organic layer 14.

The organic layer-forming composition for forming an underlying organic layer 14 includes an organic solvent, an organic compound (such as a monomer, a dimer, a trimer, an oligomer, and a polymer) for forming an underlying organic layer 14, a surfactant, a silane coupling agent, and the like, as described above.

Various publicly known methods such as a die coating method, a dip coating method, an air knife coating method, a curtain coating method, a roller coating method, a wire bar coating method, and a gravure coating method can be employed for applying the organic layer-forming composition in the coating unit 42.

The support 12 coated with the organic layer-forming composition for forming an underlying organic layer 14 is then heated by the drying unit 46. As a result, the organic solvent is removed to dry the organic layer-forming composition.

The drying unit 46 has a drying unit 46a that performs drying by heating from the front surface side (organic layer-forming composition (side on which the underlying organic layer 14 or the like is formed)) and a drying unit 46b that performs drying by heating from the back-surface side of the support 12. The drying unit 46 performs drying of the organic layer-forming composition form both the front surface side and the back-surface side.

Heating in the drying unit 46 may be performed by a publicly known method for heating a sheet-like product. For example, the drying unit 46a on the front surface side is a hot-air drying unit, and the drying unit 46b on the back-surface side is a heat roller (a guide roller having a heating mechanism).

The support 12 in which the organic layer-forming composition for forming an underlying organic layer 14 is dried is then irradiated with ultraviolet rays or the like by the light irradiation unit 48. As a result, the organic compound is polymerized (crosslinked) and cured to form an underlying organic layer 14. Curing of the organic compound for forming the underlying organic layer 14 may be performed in an inert atmosphere such as a nitrogen atmosphere as needed.

The support 12 having the underlying organic layer 14 thereon is transported by the transportation roller pair 56 and wound by the winding shaft 52 into a roll. Here, in the organic film-forming apparatus 40, a protective film Ga fed from a supply roll 49 is laminated on the underlying organic layer 14 in the transportation roller pair 56 to protect the underlying organic layer 14.

When the formation of the underlying organic layer 14 having a predetermined length is finished, the resulting support 12 is cut as needed and then supplied to the inorganic film-forming apparatus 60 illustrated in FIG. 8 as a roll 12aR obtained by winding a support 12a having the underlying organic layer 14 thereon. The roll 12aR is subjected to the formation of an inorganic layer 16 and the lamination and joining of a resin film 18.

The roll 12aR is loaded on a rotational shaft 76 of the supply chamber 62 in the inorganic film-forming apparatus 60.

After the roll 12aR is loaded on the rotational shaft 76, the support 12 having the underlying organic layer 14 thereon is unwound and caused to pass through a predetermined path that extends from the supply chamber 62 to a winding shaft 98 of the winding chamber 68 through the deposition chamber 64.

After the support 12 is caused to pass through the predetermined path, vacuum evacuation means 62v of the supply chamber 62, vacuum evacuation means 64v of the deposition chamber 64, and vacuum evacuation means 68v of the winding chamber 68 are driven so that the pressure in the inorganic film-forming apparatus 60 reaches a predetermined value.

The support 12a having the underlying organic layer 14 thereon and fed from the roll 12aR is guided by a guide roller 78 and transported to the deposition chamber 64.

The support 12a that has been transported to the deposition chamber 64 is guided by a guide roller 82 and wound around a drum 84, and is subjected to formation of an inorganic layer 16 by deposition means 86, for example, CCP-CVD, while being supported by the drum 84 and transported through a predetermined path (deposition step). In forming the inorganic layer 16, prior to the formation of the inorganic layer 16, the protective film Ga laminated on the underlying organic layer 14 is peeled off on the guide roller 82 and collected by a collection roll 90.

As described above, the inorganic layer 16 can be formed by a publicly known gas-phase deposition method such as plasma CVD, e.g., CCP-CVD or ICP-CVD; sputtering, e.g., magnetron sputtering or reactive sputtering; or vacuum vapor deposition in accordance with the inorganic layer 16 to be formed. Accordingly, for example, process gases to be used and deposition conditions are appropriately set and selected in accordance with the inorganic layer 16 to be formed, the film thickness, and the like.

A film roll 18R obtained by winding a long resin film 18 is loaded in the deposition chamber 64.

For the support 12 having the inorganic layer 16 (and the underlying organic layer 14) thereon, the inorganic layer 16 is laminated, on a lamination roller 92, with a resin film 18 that is unwound from the film roll 18R (lamination step). In the description below, a product obtained by laminating a resin film 18 on a support 12 on which an inorganic layer 16 has been formed is also referred to as a "film laminate".

Subsequently, the film laminate is heated by heating means 94 (heating step).

As described above, the surface of the inorganic layer 16 immediately after being formed is in an active state, and a Si radical, Si—O—, SiOH, etc. are present on the surface. Furthermore, the resin film 18 has hydroxy groups.

Therefore, when the film laminate obtained by laminating the inorganic layer 16 and the resin film 18 that are disposed to face with each other is heated by the heating means 94, dehydration condensation reaction is caused between the Si radical, Si—O—, SiOH, etc. on the surface of the inorganic layer 16 and the hydroxy groups of the resin film 18, as described above. This dehydration condensation reaction forms a covalent bond of Si—O—C between the inorganic layer 16 and the resin film 18, and the resin film 18 and the inorganic layer 16 are chemically bonded to each other. Consequently, the gas barrier film 10 is produced in which the resin film 18 in the solid state and the inorganic layer 16 in the solid state are directly joined to each other without a sticking layer therebetween.

The method for heating the film laminate by the heating means 94 (in the heating step) is not limited, and various publicly known methods can be employed.

Examples of the method include heating with a heating lamp such as an infrared lamp, heating with a heater, and heating with a heat roller.

During heating by the heating means 94, it is preferable to press the film laminate (the inorganic layer 16 and the resin film 18) by, for example, nip transport (where heating may be performed) with a nip roller so as to smooth out creases between the inorganic layer 16 and the resin film 18 and bring these components into close contact with each other.

The temperature during heating of the film laminate by the heating means 94 (in the heating step) is also not limited. The temperature may be appropriately set in accordance with, for example, the materials of the inorganic layer 16 and the resin film 18 such that the dehydration condensation reaction proceeds and the resin film 18, the support 12, and other components are not degraded.

Here, the heating of the film laminate by the heating means 94 is preferably performed such that the temperature of the support 12 is 100° C. or higher and more preferably 110° C. or higher from the viewpoints of, for example, suitably causing the dehydration condensation reaction to proceed and removing generated water.

The heating time is also not limited but is preferably about 0.1 to 10 seconds.

The gas barrier film 10 produced by joining the inorganic layer 16 and the resin film 18 by heating with the heating means 94 is transported from the opening 72a to the winding chamber 68, guided by a guide roller 96, and wound by a winding shaft 98 into a roll. Thus, a gas barrier film roll 10R is produced by winding the gas barrier film 10.

In the production method of the present invention, a loading section of the film roll 18R obtained by winding a long resin film 18, the lamination roller 92, and the heating means 94 may be disposed in the winding chamber 68 rather than the deposition chamber 64. In such a case, the production method of the present invention may include, in the winding chamber 68, laminating the resin film 18 with the support 12 having the inorganic layer 16 (or further having the underlying organic layer 14) thereon, that is, forming a film laminate, and heating the film laminate by the heating means 94.

When the production of the gas barrier film 10 is completed, cleaned dry air is introduced into all the chambers of the inorganic film-forming apparatus 60, and the chambers are opened to the atmosphere. Subsequently, cutting is performed as required, and the gas barrier film roll 1 OR obtained by winding the gas barrier film 10 is taken out from the winding chamber 68 of the inorganic film-forming apparatus 60.

As described above, in the case of producing a gas barrier film having a plurality of sets of a combination of an inorganic layer 16 on the support 12 side and a resin film 18 on the opposite side of the support, the formation of the inorganic layer 16 by the inorganic film-forming apparatus 60, the lamination of the resin film 18, and the heating (joining) of the film laminate are repeatedly performed in accordance with the number of sets of the combination of the inorganic layer 16 and the resin film 18.

In the case of producing a gas barrier film having no underlying organic layer 14, the support 12 is subjected to only the formation of the inorganic layer 16 by the inorganic film-forming apparatus 60, the lamination of the resin film 18, and the heating (joining) of the film laminate without being subjected to the formation of the underlying organic layer 14 by the organic film-forming apparatus 40.

In the case of producing a gas barrier film having a plurality of sets of a combination of an underlying organic layer 14 and an inorganic layer 16, the formation of the underlying organic layer 14 and the formation of the inorganic layer 16 without lamination with a resin film 18 are repeatedly performed in accordance with the number of sets of the combination of the underlying organic layer 14 and the inorganic layer 16. In such a case, the lamination of the resin film 18 and the heating (joining) of the film laminate are performed after the formation of at least one inorganic layer 16, for example, after the formation of the last inorganic layer 16. In this case, when the resin film 18 is not laminated on the inorganic layer 16, the inorganic layer 16 is preferably protected by laminating a protective film Ga on the inorganic layer 16.

Furthermore, as illustrated in FIG. 6, in forming a hard coat layer 28 on a surface of a support 12 opposite to a surface on which the inorganic layer 16 and the other layers are formed, the hard coat layer 28 is formed, as in the underlying organic layer 14, on a surface of the support 12 opposite to the surface on which the inorganic layer 16 and the other layers are formed, for example, before the formation of the inorganic layer 16 or after the lamination of a resin film 18 on the inorganic layer 16.

In the example illustrated in FIG. 8, the lamination of the resin film 18 with the inorganic layer 16 and the heating of the film laminate are performed in the inorganic film-forming apparatus 60 (in the vacuum chamber) for forming the inorganic layer 16. However, the production method of the present invention is not limited to this.

For example, in the deposition chamber 64, the inorganic layer 16 may be laminated with a protective film Ga without lamination with a resin film 18 and wound, and a roll obtained by winding the support 12 having the inorganic layer 16 thereon may be taken out from the inorganic film-forming apparatus 60. Subsequently, in another apparatus, the support 12 may be unwound from the roll, and the protective film Ga may be peeled off while the support 12 is transported in the longitudinal direction. Subsequently, the inorganic layer 16 may be laminated with a resin film 18 to form a film laminate, and the film laminate may then be heated.

Alternatively, in the inorganic film-forming apparatus 60, only the lamination of a resin film 18 with the inorganic layer 16 may be performed, the resulting film laminate may be wound, and a roll obtained by winding the film laminate may be taken out from the inorganic film-forming apparatus 60. Subsequently, in another apparatus, the film laminate may be unwound from the roll and heated while being transported in the longitudinal direction.

Even if the lamination of the resin film 18 and heating are performed after about several days elapse from the formation of the inorganic layer 16, the inorganic layer 16 and the resin film 18 can be joined to each other by causing the dehydration condensation reaction.

However, as the time elapsed after the formation of the inorganic layer 16 increases, the heating temperature of the film laminate needs to be increased in order to join the inorganic layer 16 to the resin film 18 with a sufficient adhesion strength, and the possibility of degradation of the support 12 and the resin film 18 increases.

In addition, the surface of the inorganic layer 16 is the most active immediately after the formation of the inorganic layer 16. Therefore, a shorter time from the formation of the inorganic layer 16 to heating of the film laminate enables the inorganic layer 16 and the resin film 18 to be joined to each other with a higher adhesion strength at a lower heating temperature.

Furthermore, in the case where a roll including an inorganic layer 16 is taken out from the inorganic film-forming apparatus 60, and the lamination of a resin film 18 and the heating of the resulting film laminate are performed in another apparatus, the operation are complicated, and production efficiency is also poor. In addition, the inorganic layer 16 and the resin film 18 more satisfactorily come in close contact with each other in vacuum. Similarly, in the case where a roll obtained by winding a film laminate is taken out from the inorganic film formation apparatus 60, and the film laminate is heated in another apparatus, the operations are complicated, and production efficiency is also poor.

Considering this point, as in the inorganic film-forming apparatus 60 illustrated in FIG. 8, it is preferable to, after the formation of an inorganic layer 16, laminate a resin film 18 with the inorganic layer 16 and to further heat the resulting film laminate in vacuum in which the inorganic layer 16 has been deposited.

The gas barrier film and the method for producing a gas barrier film according to embodiments of the present invention have been described in detail. However, the present invention is not limited to the embodiment described above, and various improvements and modifications may be made without departing from the spirit of the present invention.

For example, in a preferred embodiment of the above method for producing a gas barrier film, all the steps of forming an underlying organic layer, forming an inorganic layer, laminating a resin film, and heating the resulting film laminate are performed by R-to-R. Alternatively, at least one of the steps may be performed in a batch process after the film is cut. Alternatively, for a cut sheet, all the steps may be performed in a batch process.

EXAMPLES

Hereafter, the present invention will be specifically described with reference to Examples. The present invention is not limited to the specific examples described below.

Example 1

Production of Gas Barrier Film

A PET film (COSMOSHINE A4300, manufactured by Toyobo Co., Ltd., refractive index: 1.54) having a thickness of 100 μm was prepared as a support.

A silicon nitride layer (SiN) was formed as an inorganic layer on a surface of the support by using a typical R-to-R inorganic film-forming apparatus for forming a film by CCP-CVD, as illustrated in FIG. 8.

A deposition chamber of the inorganic film-forming apparatus has a loading section of a roll obtained by winding a long film and a lamination roller for laminating the film on a surface of an inorganic layer after deposition, as illustrated in FIG. 8.

Furthermore, in the deposition chamber of the inorganic film-forming apparatus, a pair of nip rollers, one of which functions as a heat roller was disposed as heating means for heating a laminate (film laminate) after the film is laminated on the surface of the inorganic layer.

A silane gas (flow rate: 160 sccm), an ammonia gas (flow rate: 370 sccm), a hydrogen gas (flow rate: 590 sccm), and a nitrogen gas (flow rate: 240 sccm) were used as source gases for forming the inorganic layer. The high-frequency power supply used was a high-frequency power supply with a frequency of 13.56 MHz. The plasma excitation power was 800 W. The deposition pressure was 40 Pa.

The thickness of the inorganic layer formed was 20 nm.

A film roll obtained by winding a long resin film was loaded in the loading section of a roll. As the resin film, EVAL EF-XL manufactured by Kuraray Co., Ltd. (EVOH film, thickness: 12 μm, melting point: 180° C., refractive index: 1.48) was used.

After the formation of the inorganic layer, the resin film was laminated with the inorganic layer by the lamination roller to form a film laminate. The film laminate was heated by the heating means. Thus, a gas barrier film was produced. The heating by the heating means was performed such that the temperature of the support was 110° C.

Figure 4:
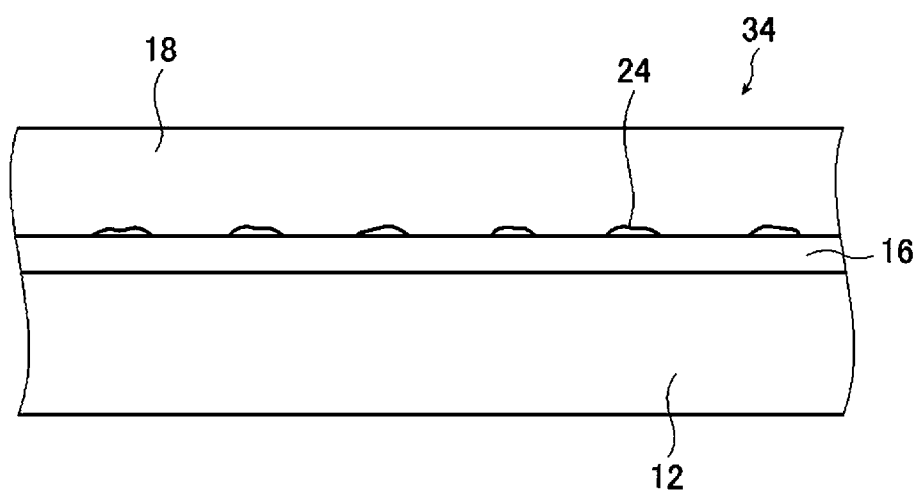
FIG. 4 is a conceptual diagram illustrating another example of a gas barrier film of the present invention.

That is, this gas barrier film has a layer configuration including a support, an inorganic layer, and a resin film as illustrated in FIG. 4.

Example 2

A gas barrier film was produced as in Example 1 except that EVAL EF-F manufactured by Kuraray Co., Ltd. (EVOH film, thickness: 12 μm, melting point: 180° C., refractive index: 1.48) was used as the resin film.

Example 3

A gas barrier film was produced as in Example 1 except that EVAL EF-E manufactured by Kuraray Co., Ltd. (EVOH film, thickness: 30 μm, melting point: 160° C., refractive index: 1.48) was used as the resin film.

Example 4

A gas barrier film was produced as in Example 1 except that EVAL EF-CR manufactured by Kuraray Co., Ltd. (EVOH film, thickness: 15 μm, melting point: 160° C., refractive index: 1.48) was used as the resin film.

Example 5

TMPTA (manufactured by DAICEL-ALLNEX LTD.) and a photopolymerization initiator (manufactured by Lamberti, ESACURE KTO 46) were prepared and weighed such that a weight ratio of the TMPTA to the photopolymerization initiator was 95:5. These were dissolved in methyl ethyl ketone to prepare an organic layer-forming composition for forming an underlying organic layer, the composition having a solid content of 30%.

The organic layer-forming composition prepared as described above was applied to a surface of a support with a die coater, and the resulting support was caused to pass through a drying zone at 50° C. for three minutes by using a typical R-to-R organic film-forming apparatus as illustrated in FIG. 7. Subsequently, the resulting support was irradiated with ultraviolet rays from a metal halide high-pressure mercury lamp (integrated dose: about 600 mJ/cm$^2$) to cure the organic layer-forming composition. Thus, an underlying organic layer was formed on the surface of the support. The underlying organic layer had a thickness of 2 μm.

Before the support having the underlying organic layer thereon was wound, a protective film made of PE was stuck on the surface of the underlying organic layer.

A gas barrier film was produced as in Example 1 except that the protective film was peeled off and an inorganic layer was formed on the underlying organic layer. That is, this gas barrier film has a layer configuration including a support, an underlying organic layer, an inorganic layer, and a resin film as illustrated in FIG. 1.

Example 6

3-Glycidoxypropyltriethoxysilane (manufactured by Shin-Etsu Chemical Co., Ltd., KBE-403) and tetraethoxysilane (manufactured by Shin-Etsu Chemical Co., Ltd., KBE-04) were prepared.

While an aqueous acetic acid solution was vigorously stirred at 40° C., the 3-glycidoxypropyltriethoxysilane was added dropwise to the aqueous acetic acid solution over a period of three minutes. Next, the tetraethoxysilane was added to the aqueous acetic acid solution over a period of five minutes under vigorous stirring. Subsequently, stirring was continued at 40° C. for three hours to prepare an aqueous silanol solution.

Next, a curing agent (aluminum chelate (Aluminum Chelate D, manufactured by Kawaken Fine Chemicals Co., Ltd.)) and surfactants (RAPISOL a90 manufactured by NOF Corporation, and NAROACTY c1-95 manufactured by Sanyo Chemical Industries, Ltd.) were sequentially added to the aqueous silanol solution to prepare an aqueous organic layer-forming composition.

The concentration of ethanol generated in the aqueous organic layer-forming composition by hydrolysis was quantitatively determined by gas chromatography. According to the result, the rate of hydrolysis of the alkoxysilane was 99.4%.

The aqueous organic layer-forming composition prepared as described above was applied to a surface of a support with a bar coater and dried by causing the support to pass through a drying zone at 150° C. for two minutes by using a typical R-to-R organic film-forming apparatus as illustrated in FIG. 7. Thus, an underlying organic layer was formed on the surface of the support. The underlying organic layer had a thickness of 2 μm.

Before the support having the underlying organic layer thereon was wound, a protective film made of PE was stuck on the surface of the underlying organic layer.

A gas barrier film was produced as in Example 1 except that the protective film was peeled off and an inorganic layer was formed on the underlying organic layer. That is, this gas barrier film has a layer configuration including a support, an underlying organic layer, an inorganic layer, and a resin film as illustrated in FIG. 1.

Example 7

A gas barrier film was produced as in Example 1 except that a PET film (COSMOSHINE A4300, manufactured by Toyobo Co., Ltd., refractive index: 1.54) having a thickness of 23 μm was used as the support.

Example 8

A gas barrier film was produced as in Example 1 except that a PET film (COSMOSHINE A4300, manufactured by Toyobo Co., Ltd., refractive index: 1.54) having a thickness of 50 μm was used as the support.

Example 9

A gas barrier film was produced by further forming a silicon nitride layer having a thickness of 20 nm as an inorganic layer (second inorganic layer) in the same manner on the surface of the resin film of the gas barrier film produced in Example 1. That is, this gas barrier film has a layer configuration including a support, an inorganic layer, a resin film, and a second inorganic layer.

Example 10

A gas barrier film was produced by further forming a silicon nitride layer having a thickness of 20 nm as an inorganic layer (second inorganic layer) in the same manner on the surface of the resin film of the gas barrier film produced in Example 1, further laminating a resin film (second resin film) thereon, and performing heating in the same manner. That is, this gas barrier film has a layer configuration including a support, an inorganic layer, a resin film, a second inorganic layer, and a second resin film.

Example 11

A gas barrier film was produced by further forming a silicon nitride layer having a thickness of 20 nm as an inorganic layer (second inorganic layer) in the same manner on the surface of the resin film of the gas barrier film produced in Example 5, further laminating a resin film (second resin film) thereon, and performing heating in the same manner. That is, this gas barrier film has a layer configuration including a support, an underlying organic layer, an inorganic layer, a resin film, a second inorganic layer, and a second resin film as illustrated in FIG. 2.

Example 12

A gas barrier film was produced by further forming a silicon nitride layer having a thickness of 20 nm as an inorganic layer (second inorganic layer) in the same manner on the surface of the resin film of the gas barrier film produced in Example 6, further laminating a resin film (second resin film) thereon, and performing heating in the same manner. That is, this gas barrier film has a layer configuration including a support, an underlying organic layer, an inorganic layer, a resin film, a second inorganic layer, and a second resin film as illustrated in FIG. 2.

Example 13

A gas barrier film having a layer configuration including a support, an inorganic layer, and a resin film was prepared as in Example 7.

In a roll loading section of a deposition chamber of a typical R-to-R inorganic film-forming apparatus for forming a film by CCP-CVD as illustrated in FIG. 8, a roll obtained by winding the gas barrier film prepared above was loaded such that the resin film side faced an object to be laminated.

A gas barrier film was produced by forming an inorganic layer on a support as in Example 7 except that the above gas barrier film was used as a resin film, and the lamination and heating were performed in the same manner. That is, this gas barrier film has a layer configuration including a support, an inorganic layer, a resin film, a second inorganic layer, and a second support as illustrated in FIG. 5.

Example 14

In Example 1, after the lamination of a resin film, a film laminate was prepared without heating and then wound.

A roll of this film laminate was loaded in a typical R-to-R organic film-forming apparatus as illustrated in FIG. 7 and heated in air at 110° C. Thus, a gas barrier film was produced. That is, this gas barrier film has a layer configuration including a support, an inorganic layer, and a resin film as illustrated in FIG. 4.

Example 15

A gas barrier film was produced as in Example 14 except that the film laminate was heated at 120° C.

Comparative Example 1

A PE film (PAC-3J-30H, manufactured by Sun A. Kaken Co., Ltd., refractive index: 1.54) having a thickness of 30 μm was prepared as a resin film. Since this resin film is a PE film, the resin film has no hydroxy group.

A gas barrier film was produced as in Example 1 except that this resin film was used. That is, this gas barrier film has a layer configuration including a support, an inorganic layer, and a resin film as illustrated in FIG. 4. This PE film has stickiness on one surface thereof. The sticky surface of the PE film was laminated with the inorganic layer.

Reference Example

ACRIT 8BR-930 manufactured by Taisei Fine Chemical Co., Ltd. (UV-curable urethane acrylic polymer having a weight-average molecular weight of 16,000), DIANAL BR83 manufactured by Mitsubishi Rayon Co., Ltd. (PMMA having a weight-average molecular weight of 40,000), A-DPH (DPHA) manufactured by Shin-Nakamura Chemical Co., Ltd., KBM5103 manufactured by Shin-Etsu Silicone (silane coupling agent), and ESACURE KTO 46 manufactured by Lamberti (photopolymerization initiator) were prepared.

These materials were weighed such that a ratio represented by urethane acrylic polymer:PMMA:DPHA:silane coupling agent: photopolymerization initiator was 35:22:30:10:3 in terms of mass ratio. These were dissolved in methyl ethyl ketone to prepare a coating solution having a solid content of 30%.

An inorganic layer was formed on a support as in Example 1, a protective film made of PE was laminated on the inorganic layer instead of the resin film, and the resulting support was wound without heating.

The roll of the support having the inorganic layer thereon and laminated with the protective film was loaded in a typical R-to-R organic film-forming apparatus as illustrated in FIG. 7. After the protective film was peeled off, the coating solution prepared as described above was applied with a die coater and dried at 130° C. for three minutes to form an organic layer serving as a protective layer. Thus, a gas barrier film was produced. That is, this gas barrier film has a layer configuration including a support, an inorganic layer, and a (protective) organic layer.

The organic layer had a thickness of 12 µm and a refractive index of 1.48.

Example 16

Synthesis of Compound A

Compound B shown below was synthesized in accordance with the method described in <0222> to <0223> of JP2009-236617 A.

In a reaction container, 5 g (0.0127 moles) of compound B synthesized as described above, 80 mL (liters) of methylene chloride, 6.58 g (0.030 moles) of 2-acryloyloxyethyl succinate (trade name: HOA-MS(N), manufactured by Kyoeisha Chemical Co., Ltd.), and 0.155 g (0.0013 moles) of N,N-dimethyl-4-aminopyridine were placed. While the resulting liquid mixture was stirred at room temperature, 5.8 g (0.030 moles) of 1-(3-dimethylaminopropyl)-3-ethylcarbodiimide hydrochloride was added thereto, and the resulting mixture was then allowed to react at 40° C. for one hour.

The resulting reaction solution was extracted with 200 mL of ethyl acetate and 100 mL of water. The collected organic layer was then washed with 100 mL of a saturated aqueous sodium bicarbonate solution and dried with magnesium sulfate. The organic solvent contained in the organic layer was removed by a rotary evaporator. The reaction product was purified by silica gel chromatography. As a result, 4.2 g of compound A shown below was obtained.

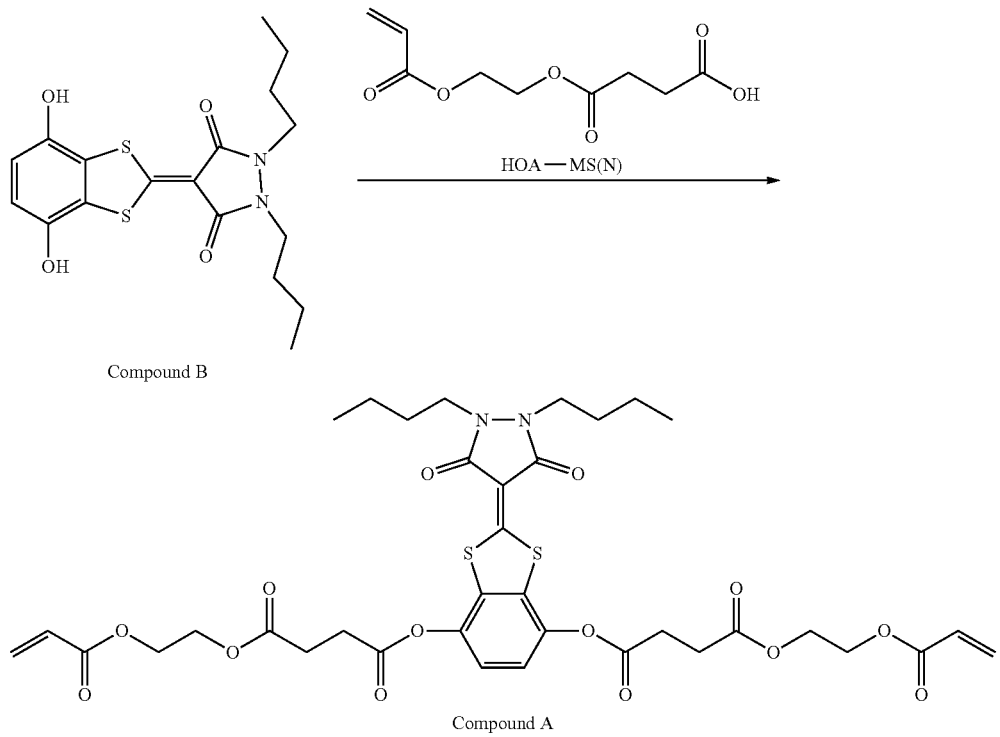

Compound B

Compound A

Formation of Hard Coat Layer

In addition to compound A synthesized as described above, dipentaerythritol hexaacrylate (A-DPH, manufactured by Shin-Nakamura Chemical Co., Ltd.) and two types of photopolymerization initiators (IRGACURE 899 and IRGACURE 184, manufactured by BASF) were prepared. These were weighed such that a ratio represented by compound A:A-DPH:photopolymerization initiator:photopolymerization initiator was 37:56:3.5:3.5 in terms of mass ratio and diluted with a mixed solvent of methyl ethyl ketone and methyl isobutyl ketone. Thus, a coating solution for forming a hard coat layer, the coating solution having a solid content of 40%, was prepared.

By using a typical R-to-R organic film-forming apparatus as illustrated in FIG. 7, the coating solution prepared as described above was applied with a die coater to a surface of the support of the gas barrier film of Example 5, the surface being on the side opposite to a surface having the inorganic layer etc. thereon, and the resulting gas barrier film was caused to pass through a drying zone at 100° C. for three minutes. Subsequently, the resulting gas barrier film was irradiated with ultraviolet rays from a metal halide high-pressure mercury lamp (integrated dose: about 600 mJ/cm$^2$) while being heated at 60° C. from the back surface thereof to thereby cure the coating solution. Thus, a hard coat layer (first HC layer) was formed. The hard coat layer had a thickness of 5 μm. This hard coat layer functions as a blue-light cut layer.

Example 17

ACRIT 8 FX038-ME manufactured by Taisei Fine Chemical Co., Ltd., dipentaerythritol hexaacrylate (A-DPH, manufactured by Shin-Nakamura Chemical Co., Ltd.), and a photopolymerization initiator (ESACURE KTO 46, manufactured by Lamberti) were prepared. These were weighed such that a ratio represented by ACRIT:A-DPH:photopolymerization initiator was 48:48:4 in terms of mass ratio and diluted with methyl ethyl ketone. Thus, a coating solution for forming a hard coat layer, the coating solution having a solid content of 40%, was prepared.

By using a typical R-to-R organic film-forming apparatus as illustrated in FIG. 7, the coating solution prepared as described above was applied with a die coater to a surface of the hard coat layer of the gas barrier film of Example 16, and the resulting gas barrier film was caused to pass through a drying zone at 100° C. for three minutes. Subsequently, the resulting gas barrier film was irradiated with ultraviolet rays from a metal halide high-pressure mercury lamp (integrated dose: about 600 mJ/cm$^2$) while being heated at 60° C. from the back surface thereof to thereby cure the coating solution. Thus, a second-layer hard coat layer (second HC layer) was formed on the hard coat layer (first HC layer). The second-layer hard coat layer had a thickness of 1 μm. This second-layer hard coat layer functions as a sliding layer.

Confirmation of Separate Portion (Gap) at Interface Between Inorganic Layer and Resin Film Each of the gas barrier films produced as described above was cut with a microtome. The resulting section of the gas barrier film was observed with an optical microscope at an eyepiece magnification of 10 and an objective lens magnification of 100. On an interface that was arbitrarily selected and that had a length of 55 mm, a ratio of a total of the lengths of separate portions to 55 mm of the interface (total length of the interface) was determined.

This determination was performed at arbitrary 10 positions of the section, and the average of the results was defined as, on the interface between the inorganic layer and the resin film of the gas barrier film, the ratio of the total of the lengths of the separate portions to the total length of the interface.

According to the results, all the gas barrier films of Examples 1 to 17 each had a plurality of partial separate portions (gaps) at the interface between the inorganic layer and the resin film, showing that these gas barrier films were gas barrier films according to the present invention. Furthermore, in all the gas barrier films, the ratio of the total of the lengths of the separate portions to the total length of the interface fell in the range of 0.01% to 50%.

Regarding the gas barrier film of Comparative Example 1 in which the resin film had no OH group, delamination between the inorganic layer and the resin film occurred on the section, and the ratio of the total of the lengths of the separate portions to the total length of the interface could not be determined.

Regarding Reference Example, in which the (protective) organic layer was formed by coating, no separate portions were observed at the interface between the inorganic layer and the organic layer.

With regard to each of the gas barrier films produced as described above, adhesion, gas barrier properties, a total light transmittance, and a haze were measured.

Adhesion

The adhesion between the inorganic layer and the resin film was evaluated by a cross-cut peel test in accordance with JIS K5600-5-6 (1999).

Cuts were formed on the resin film on a surface of each of the gas barrier films at an angle of 90° with respect to the film surface and an interval of 1 mm with a cutter knife, thus forming a grid constituted by 100 squares having a side of 1 mm. The Mylar tape (manufactured by Nitto Denko Corporation, polyester tape, No. 31B) having a width of 2 cm was applied onto the above surface and then peeled off. For a sample whose outermost surface is not constituted by a resin film, the test was similarly performed for a layer adjacent to a resin film.

The adhesion was evaluated on the basis of the number of squares where the resin film remained (maximum: 100).

Gas Barrier Properties

A water vapor transmission rate (WVTR) [g/(m$^2$·day)] of each of the gas barrier films was measured at a temperature of 40° C. and a relative humidity of 90% RH by a calcium corrosion method (the method described in JP2005-283561A).

Total Light Transmittance and Haze

For each of the gas barrier films, the total light transmittance and the haze was were measured in accordance with JIS K 7361-1 (1996) and JIS K 7136 (2000), respectively, by using SH-7000 manufactured by Nippon Denshoku Industries Co., Ltd. With regard to Examples 16 and 17, a light transmittance at 420 nm was also measures by using the same device.

The results are shown in Table 1 (Examples 1 to 15, Comparative Example 1, and Reference Example (all of which included no hard coat layer) and Table 2 (Examples 16 and 17 (each of which included a hard coat layer) below.

TABLE 1

| | | Example 1 | Example 2 | Example 3 | Example 4 | Example 5 | Example 6 | Example 7 | Example 8 | Example 9 |
|---|---|---|---|---|---|---|---|---|---|---|
| Support | Material | PET | PET | PET | PET | PET | PET | PET | PET | PET |
| | Thickness [μm] | 100 | 100 | 100 | 100 | 100 | 100 | 23 | 50 | 100 |
| | Refractive index | 1.54 | 1.54 | 1.54 | 1.54 | 1.54 | 1.54 | 1.54 | 1.54 | 1.54 |
| Underlying organic layer | Material | — | — | — | — | TMPTA | Silane | — | — | — |
| | Thickness [μm] | — | — | — | — | 2 | 2 | — | — | — |
| Inorganic layer | Material | SiN | SiN | SiN | SiN | SiN | SiN | SiN | SiN | SiN |
| | Thickness [nm] | 20 | 20 | 20 | 20 | 20 | 20 | 20 | 20 | 20 |
| Resin film | Material | EVOH | EVOH | EVOH | EVOH | EVOH | EVOH | EVOH | EVOH | EVOH |
| | Thickness [μm] | 12 | 12 | 30 | 15 | 12 | 12 | 12 | 12 | 12 |
| | Refractive index | 1.48 | 1.48 | 1.48 | 1.48 | 1.48 | 1.48 | 1.48 | 1.48 | 1.48 |
| | Joining conditions Vacuum/Air | Vacuum | Vacuum | Vacuum | Vacuum | Vacuum | Vacuum | Vacuum | Vacuum | Vacuum |
| | Heating [° C.] | 110 | 110 | 110 | 110 | 110 | 110 | 110 | 110 | 110 |
| Second inorganic layer | Material | — | — | — | — | — | — | — | — | SiN |
| | Thickness [nm] | — | — | — | — | — | — | — | — | 20 |
| Second resin film | Material | — | — | — | — | — | — | — | — | — |
| | Thickness [μm] | — | — | — | — | — | — | — | — | — |
| | Refractive index | — | — | — | — | — | — | — | — | — |
| | Joining conditions Vacuum/Air | — | — | — | — | — | — | — | — | — |
| | Heating [° C.] | — | — | — | — | — | — | — | — | — |
| Evaluation | Adhesion [Number of squares] | 100 | 98 | 95 | 98 | 100 | 100 | 100 | 100 | 99 |
| | Gas barrier properties [g/m² · day] | $1 \times 10^{-3}$ | $1 \times 10^{-3}$ | $8 \times 10^{-4}$ | $1.6 \times 10^{-3}$ | $1 \times 10^{-4}$ | $1 \times 10^{-4}$ | $1.5 \times 10^{-3}$ | $1.3 \times 10^{-3}$ | $1 \times 10^{-4}$ |
| | Total light transmittance [%] | 90 | 90 | 90 | 90 | 92 | 92.5 | 91 | 90.5 | 86 |
| | Haze [%] | 2.4 | 2.4 | 2.4 | 2.4 | 2.1 | 2.2 | 2.4 | 2.4 | 2.4 |

In the above table, Silane represents an alkoxysilane.
EVOH each represent EVAL manufactured by Kuraray Co., Ltd. EVOH in Example 2 is EF-F, EVOH in Example 3 is EF-E, EVOH in Example 4 is EF-CR, and EVOH in all the other examples is EF-XL.

| | | Example 10 | Example 11 | Example 12 | Example 13 | Example 14 | Example 15 | Comparative Example 1 | Reference Example |
|---|---|---|---|---|---|---|---|---|---|
| Support | Material | PET | PET | PET | PET | PET | PET | PET | PET |
| | Thickness [μm] | 100 | 100 | 100 | 23 | 100 | 100 | 100 | 100 |
| | Refractive index | 1.54 | 1.54 | 1.54 | 1.54 | 1.54 | 1.54 | 1.54 | 1.54 |
| Underlying organic layer | Material | — | TMPTA | Silane | — | — | — | — | — |
| | Thickness [μm] | — | 2 | 2 | — | — | — | — | — |
| Inorganic layer | Material | SiN | SiN | SiN | SiN | SiN | SiN | SiN | SiN |
| | Thickness [nm] | 20 | 20 | 20 | 20 | 20 | 20 | 20 | 20 |
| Resin film | Material | EVOH | EVOH | EVOH | EVOH | EVOH | EVOH | PE | Acrylate |
| | Thickness [μm] | 12 | 12 | 12 | 12 | 12 | 12 | 30 | 12 |
| | Refractive index | 1.48 | 1.48 | 1.48 | 1.48 | 1.48 | 1.48 | 1.54 | 1.48 |
| | Joining conditions Vacuum/Air | Vacuum | Vacuum | Vacuum | Vacuum | Air | Air | Vacuum | Coated with organic layer |
| | Heating [° C.] | 110 | 110 | 110 | 110 | 110 | 120 | 110 | |
| Second inorganic layer | Material | SiN | SiN | SiN | SiN | — | — | — | — |
| | Thickness [nm] | 20 | 20 | 20 | 20 | — | — | — | — |
| Second resin film | Material | EVOH | EVOH | EVOH | PET | — | — | — | — |
| | Thickness [μm] | 12 | 12 | 12 | 23 | — | — | — | — |
| | Refractive index | 1.48 | 1.48 | 1.48 | 1.54 | — | — | — | — |
| | Joining conditions Vacuum/Air | Vacuum | Vacuum | Vacuum | (Support) | — | — | — | — |
| | Heating [° C.] | 110 | 110 | 110 | | — | — | — | — |
| Evaluation | Adhesion [Number of squares] | 98 | 98 | 98 | 96 | 85 | 88 | 0 | 90 |
| | Gas barrier properties [g/m² · day] | $8 \times 10^{-5}$ | $2 \times 10^{-5}$ | $2.1 \times 10^{-5}$ | $1 \times 10^{-4}$ | $1 \times 10^{-3}$ | $1 \times 10^{-3}$ | $1 \times 10^{-1}$ | $2 \times 10^{-3}$ |
| | Total light transmittance [%] | 90 | 90 | 90.5 | 90 | 89 | 90 | 89 | 89 |
| | Haze [%] | 2.8 | 2.7 | 2.6 | 2.8 | 3.5 | 3.5 | 4 | 2 |

In the above table, Silane represents an alkoxysilane.
EVOH each represent EVAL manufactured by Kuraray Co., Ltd. EVOH in Example 2 is EF-F, EVOH in Example 3 is EF-E, EVOH in Example 4 is EF-CR, and EVOH in all the other examples is EF-XL.

TABLE 2

| | | Example 16 | Example 17 |
|---|---|---|---|
| Support | Material | PET | PET |
| | Thickness [μm] | 100 | 100 |
| | Refractive index | 1.54 | 1.54 |
| Underlying organic layer | Material | TMPTA | TMPTA |
| | Thickness [μm] | 2 | 2 |
| Inorganic layer | Material | SiN | SiN |
| | Thickness [nm] | 20 | 20 |
| Resin film | Material | EVOH | EVOH |
| | Thickness [μm] | 12 | 12 |
| | Refractive index | 1.48 | 1.48 |
| | Joining conditions Vacuum/Air | Vacuum | Vacuum |
| | Heating [° C.] | 110 | 110 |
| Second inorganic layer | Material | — | — |
| | Thickness [nm] | — | — |
| Second resin film | Material | — | — |
| | Thickness [μm] | — | — |
| | Refractive index | — | — |
| | Joining conditions Vacuum/Air | — | — |
| | Heating [° C.] | — | — |
| First HC layer | Material | Acrylate | Acrylate |
| | Thickness [μm] | 5 | 5 |
| | Function | Blue-light cut | Blue-light cut |
| Second HC layer | Material | — | Acrylate |
| | Thickness [μm] | — | 1 |
| | Function | — | Slidability |
| Evaluation | Adhesion [Number of squares] | 100 | 100 |
| | Gas barrier properties [g/m² · day] | $1 \times 10^{-4}$ | $1 \times 10^{-4}$ |
| | Total light transmittance [%] | 89 | 90 |
| | Light transmittance at 420 nm [%] | 45 | 45 |
| | Haze [%] | 2.8 | 2.6 |

EVOH each represent EVAL EF-XL manufactured by Kuraray Co., Ltd.

As shown in the tables above, the gas barrier films according to the present invention have sufficient adhesion between the inorganic layer and the resin film even without disposing a sticking layer, and in addition, have good gas barrier properties. Furthermore, good optical properties are also achieved by making the refractive index of the resin film lower than that of the support (PET film).

As shown in Examples 10 to 12, the gas barrier films including a plurality of sets of the combination of the inorganic layer and the resin film exhibit higher gas barrier properties. Furthermore, as shown in Examples 5 and 6 and Examples 11 and 12, the presence of the underlying organic layer achieves higher gas barrier properties. Comparing Examples 14 and 15 with other examples, better adhesion between the inorganic layer and the resin film is achieved by performing the lamination of the resin film and the heating of the resulting film laminate in vacuum in which the inorganic layer has been formed. Furthermore, as shown in Examples 16 and 17, by disposing the hard coat layer on a surface of the support on the side opposite to a surface having the inorganic layer and the other layers thereon, desired functions (blue-light cut (and slidability) in the above examples) can be imparted to the gas barrier films.

In contrast, the gas barrier film of Comparative Example 1, in which the resin film has no hydroxy group, has low adhesion between the inorganic layer and the resin film and low gas barrier properties due to the low adhesion.

The advantages of the present invention are apparent from the results described above.

The gas barrier film according to the present invention can be suitably used as a sealant of a solar cell or the like.

REFERENCE SIGNS LIST 10, 30, 32, 34, 36 gas barrier film
10R gas barrier film roll
12, 12a support
12aR roll
14 underlying organic layer
16 inorganic layer
18 resin film
24 separate portion
28 hard coat layer
40 organic film-forming apparatus
42 coating unit
46, 46a, 46b drying unit
48 light irradiation unit
50, 76 rotational shaft
52, 98 winding shaft
54, 56 transportation roller pair
60 inorganic film-forming apparatus
62 supply chamber
62v, 64v, 68v vacuum evacuation means
64 deposition chamber
68 winding chamber
70, 72 partition
70a, 72a opening
78, 82, 96 guide roller
84 drum
86 deposition means
90 collection roll
92 lamination roller
94 heating means
Ga protective film

What is claimed is:

1. A gas barrier film comprising, in sequence:
a support;
an inorganic layer; and
a resin film,
the inorganic layer and the resin film being supported on the support, wherein
the resin film has a hydroxy group,
the inorganic layer and the resin film are directly joined to each other with separate portions that are partially present at an interface between the inorganic layer and the resin film, and
the gas barrier film has one or more sets of a combination of the inorganic layer and the resin film.

2. The gas barrier film according to claim 1, wherein the inorganic layer includes a compound containing silicon.

3. The gas barrier film according to claim 2, wherein the inorganic layer and the resin film are joined to each other by a covalent bond of Si—O—C.

4. The gas barrier film according to claim 1, wherein the resin film is formed of an ethylene-vinyl alcohol copolymer.

5. The gas barrier film according to claim 1, wherein the resin film has a melting point of 100° C. or higher.

6. The gas barrier film according to claim 1, wherein the resin film has a lower refractive index than the support.

7. The gas barrier film according to claim 1, further comprising:
   an organic layer on a surface of the support,
   wherein the inorganic layer is disposed on a surface of the organic layer.

8. The gas barrier film according to claim 1, further comprising:
   an inorganic layer and a support in this order on a surface of the resin film on a side opposite to the inorganic layer that is directly joined to the resin film.

9. A gas barrier film comprising, in sequence:
   a support;
   an organic layer provided on the surface of the support;
   an inorganic layer provided on the surface of the organic layer; and
   a resin film,
   wherein the gas barrier film has one or more sets of a combination of the inorganic layer and the resin film,
   the inorganic layer includes a compound containing silicon,
   the resin film is formed of an ethylene-vinyl alcohol copolymer having a hydroxy group,
   the resin film has a melting point of 100° C. or higher and has a lower refractive index than the support,
   the inorganic layer and the resin film are directly joined to each other by a covalent bond of Si—O—C with separate portions that are partially present at an interface between the inorganic layer and the resin film, and
   the gas barrier film further has an inorganic layer and a support in this order on the surface of the resin film on a side opposite to the inorganic layer that is directly joined to the resin film.

* * * * *